US006317154B2

(12) United States Patent
Beiley (10) Patent No.: US 6,317,154 B2
(45) Date of Patent: Nov. 13, 2001

(54) METHOD TO REDUCE RESET NOISE IN PHOTODIODE BASED CMOS IMAGE SENSORS

(75) Inventor: Mark A. Beiley, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/798,406

(22) Filed: Mar. 2, 2001

Related U.S. Application Data (62) Division of application No. 09/032,098, filed on Feb. 27, 1998, now Pat. No. 6,243,134.

(51) Int. Cl.$^7$ ..................................................... H04N 5/335
(52) U.S. Cl. ........................ 348/308; 250/208.1; 348/241
(58) Field of Search .................................... 348/308, 307, 348/300, 241, 243, 294, 296, 297, 362; 250/208.1, 214 A; 257/290, 291, 292

(56) References Cited

U.S. PATENT DOCUMENTS

| 4,283,742 | 8/1981 | Izumita et al. . |
|---|---|---|
| 4,845,382 | 7/1989 | Eouzan et al. . |
| 5,086,344 | 2/1992 | D'Luna et al. . |
| 5,132,803 | 7/1992 | Suga et al. . |
| 5,140,162 | 8/1992 | Stettner . |
| 5,296,696 | 3/1994 | Uno . |
| 5,322,994 | 6/1994 | Uno . |
| 5,324,944 | 6/1994 | Soch et al. . |
| 5,389,971 | 2/1995 | Ishida et al. . |
| 5,398,060 | 3/1995 | Leacock et al. . |
| 5,467,130 | 11/1995 | Darden et al. . |
| 5,471,515 | 11/1995 | Fossum et al. . |
| 5,488,415 | 1/1996 | Uno . |
| 5,705,807 | 1/1998 | Throngnumchai et al. . |
| 5,777,671 | 7/1998 | Maki et al. . |
| 5,856,686 | 1/1999 | Watanabe et al. . |
| 5,880,460 | 3/1999 | Merrill . |
| 5,897,610 | 4/1999 | Jensen . |
| 5,898,168 | 4/1999 | Gowda et al. . |
| 5,900,623 | 5/1999 | Tsang et al. . |
| 5,962,844 | 10/1999 | Merrill et al. . |
| 6,011,251 | 1/2000 | Dierickx et al. . |
| 6,046,444 | 4/2000 | Afghahi . |
| 6,243,134 | * 6/2001 | Beiley ................................. 348/308 |

FOREIGN PATENT DOCUMENTS

| 0548987 | 6/1993 | (EP) . |
|---|---|---|
| 0739039 | 10/1996 | (EP) . |
| 0 758 182 A2 | 12/1997 | (EP) . |

\* cited by examiner

Primary Examiner—Wendy R. Garber
Assistant Examiner—Aung S. Moe
(74) Attorney, Agent, or Firm—Blakeley, Sokoloff, Taylor & Zafman LLP (57) ABSTRACT

A method for controlling a sensor to reduce reset noise is disclosed. The method including the steps of providing a reset command including a RESET signal and a first SAMPLE signal. The method also includes the steps of providing a read command including a first ADDRESS signal, a second SAMPLE signal, and a second ADDRESS signal. An apparatus including a system controller and a sensor controlled by the system controller is also disclosed. In one embodiment, the method and apparatus is provided for a sensor in a sensor array that is read-out in a pipelined fashion.

6 Claims, 6 Drawing Sheets

METHOD TO REDUCE RESET NOISE IN PHOTODIODE BASED CMOS IMAGE SENSORS

This application is divisional of an takes the benefit of the earlier filing date of U.S. Patent Application Ser. No. 09/032,098, filed Feb. 27, 1998, now U.S. Pat. No. 6,243,134.

BACKGROUND OF THE INVENTION

1. Field of the Invention

This invention is related to electronic image capture. Specifically, the invention is related to reducing reset noise in image sensors.

2. Description of Related Art

Image sensor circuits are used in a variety of different types of digital image capture systems, including products such as scanners, copiers, and digital cameras. The image sensor is typically composed of an array of light-sensitive pixels that are electrically responsive to incident light reflected from an object or scene whose image is to be captured.

The performance of an image capture system depends in large part on the sensitivity of each individual pixel in the sensor array and its immunity from noise. Pixel sensitivity is defined here as being related to the ratio of a change in the pixel output voltage to the photogenerated charge in the pixel. Noise here is defined as small fluctuations in a signal that can be caused by a variety of known sources. An image sensor with increased noise immunity yields sharper, more accurate images in the presence of environmental and other noise.

Improving the sensitivity of each pixel permits a reduction in exposure time which in turn allows the capture of images at a greater rate. This allows the image capture system to capture motion in the scene. In addition to allowing greater frame rate, higher pixel sensitivity also helps detect weaker incident light to capture acceptable quality images under low light conditions.

Another way to increase pixel sensitivity is to increase the efficiency of the photodiode by changing the photodiode responsivity characteristics. Doing so, however, can require deviating from a standard MOS integrated circuit fabrication process, thereby further increasing the cost of manufacturing the image sensor circuit.

Integrated circuit imaging devices include an array of light detecting elements interconnected to generate analog signals representative of an image illuminating the device. Within such an integrated circuit, each complementary metal oxide semiconductor (CMOS) image sensing element contained in the integrated circuit contains a photodiode or phototransistor as a light detecting element. In one example, charges collected in accordance with the intensity of light illuminating the photodiode or phototransistor. By storing charge, an analog signal is thus generated having a magnitude approximately proportional to the intensity of light illuminating the light detecting element.

In operation, a photo-sensitive diode is first reset by placing a charge across the photodiode. Then, the photodiode is exposed to incident light which causes the charge stored on the photodiode to be dissipated in proportion to the intensity of the incident light. After a predetermined time period during which the photodiode is exposed to the incident light and charge is allowed to dissipate from the diode (i.e., the "integration" time), the amount of charge stored on the photodiode is transferred to a capacitor by opening a switch (i.e., a "SAMPLE" transistor), between the photodiode and the capacitor.

When the time arrives to read-out the charge on the capacitor, an ADDRESS is selected. After the charge on the capacitor has been read-out, the photodiode is reset by asserting a RESET signal to a reset transistor and the reset potential which is distributed across the photodiode is read-out. The amount of incident light which is detected by the photodiode is computed by subtracting the voltage that is transferred from the capacitor from the reset voltage level on the photodiode.

When determining the amount of light detected by the photodiode, noise that is generated by the switching of the reset transistor is captured during the reset of the photodiode. In addition, due to fluctuations in the power supply voltage, the reset level varies between resets. Thus, the "noise" present in the power supply also affects the reset level. It is desirable to be able to eliminate the noise which is generated by the reset of the photodiode.

It is to be noted that although a specific architecture has been provided to describe the deficiencies in the prior art, architectures which have not been described can contain the same deficiencies. Thus, the problems described above can occur in all circuits that uses a different reset level from the level at which the photodiode begins to discharge.

It is therefore desirable to have a method of using current pixel designs to achieve improved sensitivity and noise performance using electrical circuitry available with standard MOS fabrication processes.

SUMMARY

A method for controlling a sensor to reduce reset noise is disclosed. The method including the steps of providing a reset command including a RESET signal and a first SAMPLE signal. The method also includes the steps of providing a read command including a first ADDRESS signal, a second SAMPLE signal, and a second ADDRESS signal. An apparatus for performing the above method is also disclosed.

DETAILED DESCRIPTION

The present invention provides a method for reducing reset noise in a photodiode based CMOS sensor. For purposes of explanation, specific embodiments are set forth to provide a thorough understanding of the present invention. However, it will be understood by one skilled in the art, from reading this disclosure, that the invention may be practiced without these details. Further, although the present invention is described through the use of CMOS image sensors, most, if not all, aspects of the invention apply to image sensors in general. Moreover, well-known elements, devices, process steps and the like are not set forth in detail in order to avoid obscuring the present invention.

Operation of the various embodiments of the invention will be explained using a MOS implementation of the circuits. The following short cuts are used in this disclosure to describe various operating regions of the FET. FET is said to be "turned off" when $V_{GS}$ (gate-source voltage)$\leq V_T$ (threshold voltage) for the device and the device is operating in the cut-off region where its channel acts as an open circuit. When a FET is "turned on", $V_{GS} > V_T$, $V_{DS}$ (drain-source voltage) is normally small and the device is operating in the non-saturation region.

Figure 1:
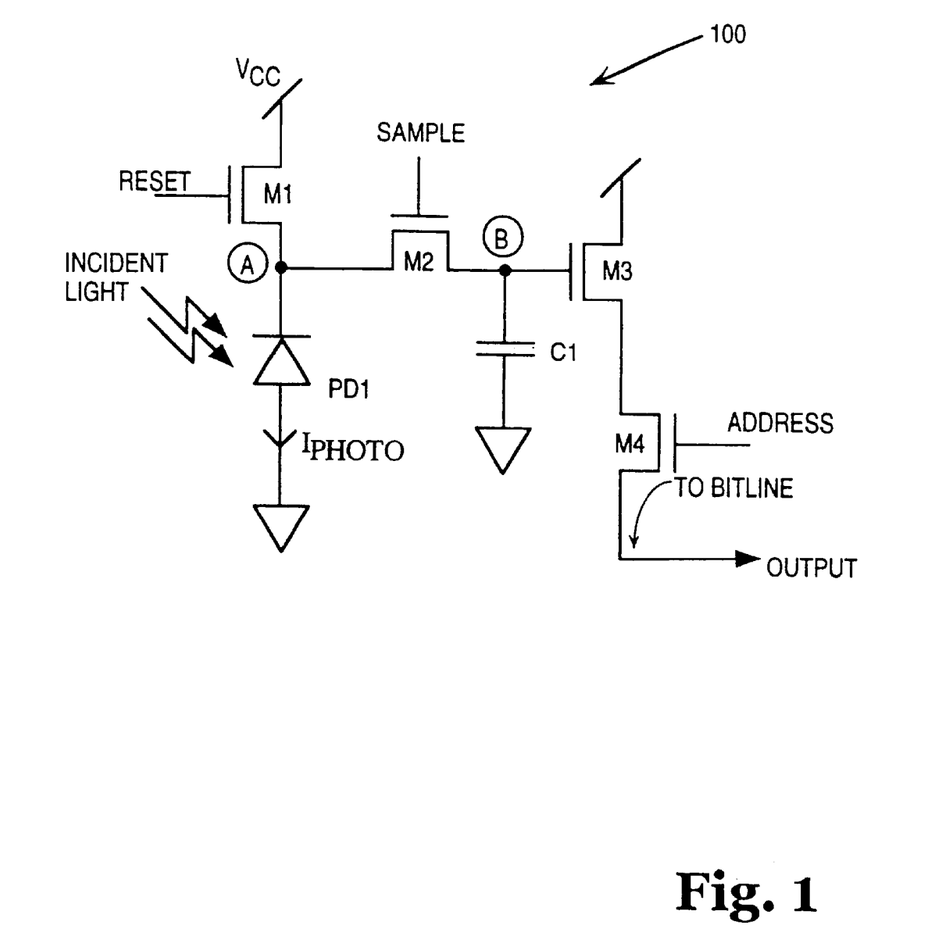
FIG. 1 illustrates a pixel circuit used in the present invention.

FIG. 1 illustrates a pixel 100 with electronic shutter that may be built using MOS fabrication processes. The pixel 100 includes a photodiode PD1 coupled to a RESET field effect transistor (FET) M1 with an electronic shutter mechanism provided by a SAMPLE transistor M2 and a storage capacitor C1. In operation, the pixel 100 is reset by applying a RESET signal which causes the RESET transistor M1 to provide a low impedance path and thus reverse bias PD1. Next, a SAMPLE signal is applied to create a low impedance path between nodes A and B, thereby charging Cl to a reset level that is typically close to the rail or supply voltage $V_{CC}$, minus the threshold voltage drop across the RESET transistor M1.

As will be discussed, a group of pixels such as pixel 100 can be arranged in rows and columns to form a sensor array. A column of pixels can have a common output line such that all of the pixels in the column are multiplexed to the single output line. In an alternate embodiment, the pixels in a row can be multiplexed to a single output line. In either case, the analog output lines from each column or row are fed to an analog post-processing circuit (including an analog-digital (A/D) conversion unit), which in turn provides digital signals to be further processed according to digital signal processing techniques. The A/D unit can be part of the sensor IC, or a different IC depending on the system implementation.

When the object or scene comes into view of the sensor circuit and the incident light is allowed to shine on PD1, node A is isolated from $V_{CC}$ by deasserting the RESET signal, and the voltage at nodes A and B begins to decay. The rate of decay is determined by the photocurrent $I_{PHOTO}$ in PD1 (caused by light-generated generated electron-hole pairs), by any leakage current through PD1, by the capacitance of C1 and by any parasitic leakage paths to the nodes A and B (not shown).

After a predetermined interval, known as the exposure or integration time, has elapsed from the moment node A is brought to the reset level and isolated, node B is also isolated by deasserting SAMPLE, thereby capturing a light-generated "exposed value" at node B. The capacitance of C1 is selected so that the exposed value may be held at node B until a related signal is read at the OUTPUT node.

To read the OUTPUT node, an ADDRESS signal is applied to the transistor M4 which acts as a switch to cause an output signal related to the exposed value to appear at the OUTPUT node. For purposes of discussion herein, the output signal at the OUTPUT node is equivalent to the signal at node B minus the threshold voltage drop of the output transistor when the ADDRESS signal is applied to transistor M4. Thus, an output value representing the exposed value appears at the OUTPUT node when the ADDRESS signal is asserted.

As discussed above, the voltage at node A (and, as the SAMPLE signal is applied to transistor M2, node B), begins to decay immediately after the time that the RESET signal is deasserted (i.e., the time that node A is decoupled from $V_{CC}$). The decay continues towards a saturation level, which represents the maximum intensity of light that pixel 100 can measure. Normally, the integration time elapses before saturation of pixel 100 occurs and the SAMPLE signal is deasserted from transistor M2 to "capture" the exposed value at node B.

After the exposed value has been read-out by asserting the ADDRESS signal, the RESET signal and the SAMPLE signal is applied to transistor M1 and transistor M2, respectively, so that node B is brought to a reset level. This reset value is read by asserting the ADDRESS signal to cause the reset level to appear at the OUTPUT node.

The difference between the reset value and the exposed value represents the amount of decay from the exposure of photodiode D1 to the incident light during the integration time. This difference is used to determine the intensity of the incident light. Due to fluctuations in the level of VCC and switching noise in the operation of transistor Ml, however, the reset value (from which the exposed value is derived), does not remain constant. Thus, each time the RESET signal is asserted to obtain a reset value at node B, a different reset value will be obtained depending on the fluctuation of the power supply. Also, the noise generated by the switching of transistor Ml (i.e. KT/C noise) adds to variation in the reset value.

Figure 2:
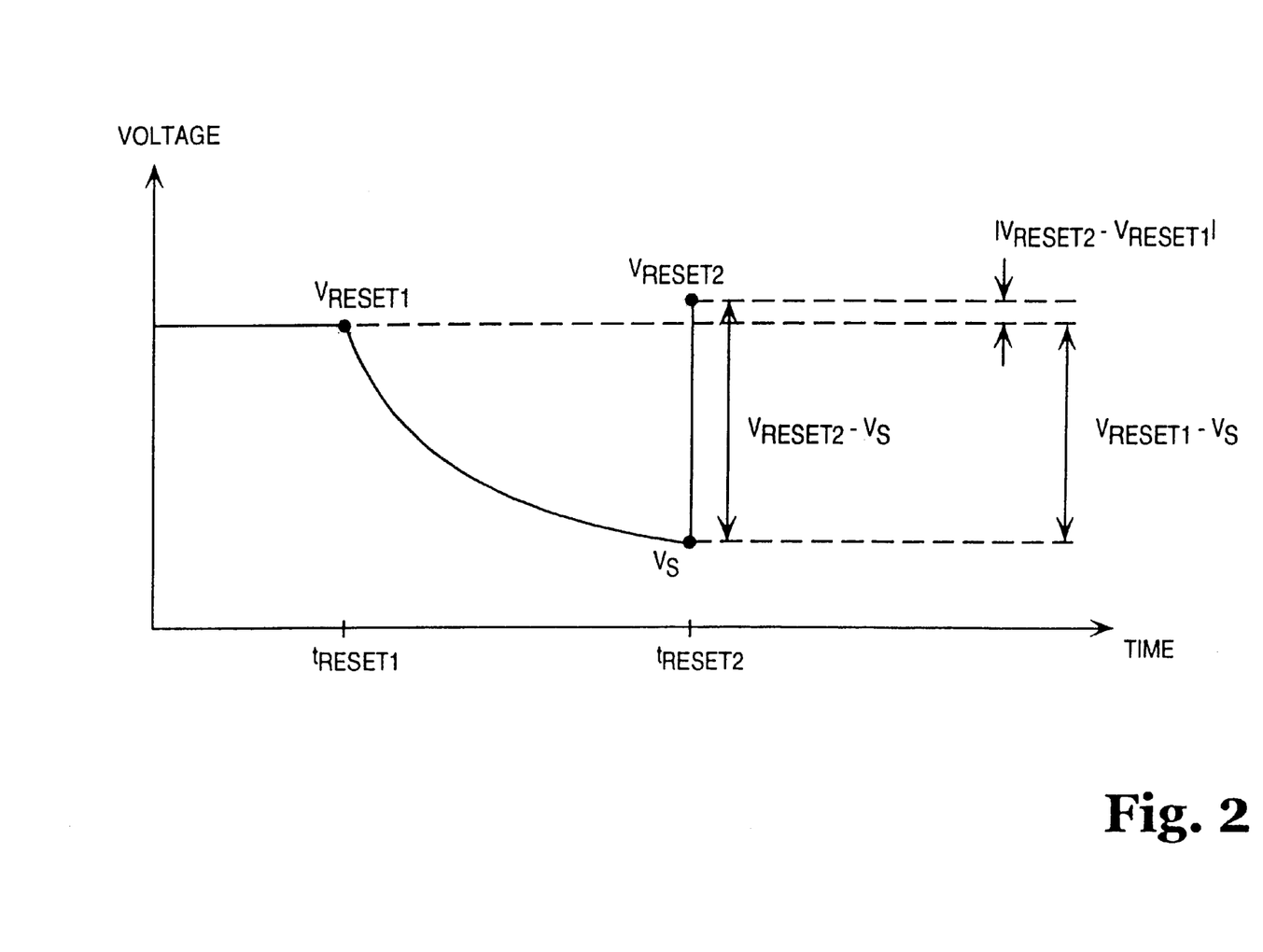
FIG. 2 is a plot of the voltage of a node in the pixel circuit of FIG. 1.

FIG. 2 is a plot of the voltage at node A over time for one cycle of the operation of pixel 100. Before time $t_{RESET1}$, where the RESET signal is provided to transistor M1, the voltage is at $V_{RESET1}$, which is approximately $V_{CC}-V_{TM1}$ (i.e., the supply voltage minus the voltage drop across transistor M1). When the SAMPLE signal is provided to transistor M2, the voltage at node B will begin to track the voltage at node A. At time $t_{RESET1}$, the RESET signal is deasserted from transistor M1, and the voltage at node A begins to decay. The voltage at node B also decays as the SAMPLE signal is still asserted to transistor M2.

At time $t_{RESET2}$, the end of the integration time, the voltage at node A and B node has reached a value S and the SAMPLE signal is deasserted from transistor M2. Thus, the sampled value S is stored at node B (i.e., on capacitor C1). The ADDRESS signal is asserted so that the sampled value S is read out. Shortly after the sampled value S is read out and the ADDRESS signal is removed, the RESET signal is applied to transistor M1, and node A is brought back to a second reset voltage $V_{RESET2}$.

As described above, to determine the intensity of the incident light, $V_{RESET2}$ is read out after sampled voltage $V_S$ has been read out, and the difference between $V_{RESET2}$ and $V_S$ (a "differential value"), is determined. If there is no noise in pixel 100; $V_{RESET2}$ would have the same value of $V_{RESET1}$. However, due to the above described noise (i.e., the switching noise of transistor or/and the fluctuation of the power supply voltage $V_{CC}$, the value of $V_{RESET2}$ is different from $V_{RESET1}$, which produces a differential value that is different from the desired differential value of $V_{RESET1}-V_S$. The difference between $V_{RESET2}$ and $V_{RESET1}$ is the "reset noise."

The present invention provides a method to eliminate the reset noise described above. In a preferred embodiment, a reset voltage is stored before the integration period, and is read out before the sampled value is read out. The preferred embodiment also uses a capture method known as a "pipelined" method for capturing an image, as described below.

Figure 3:
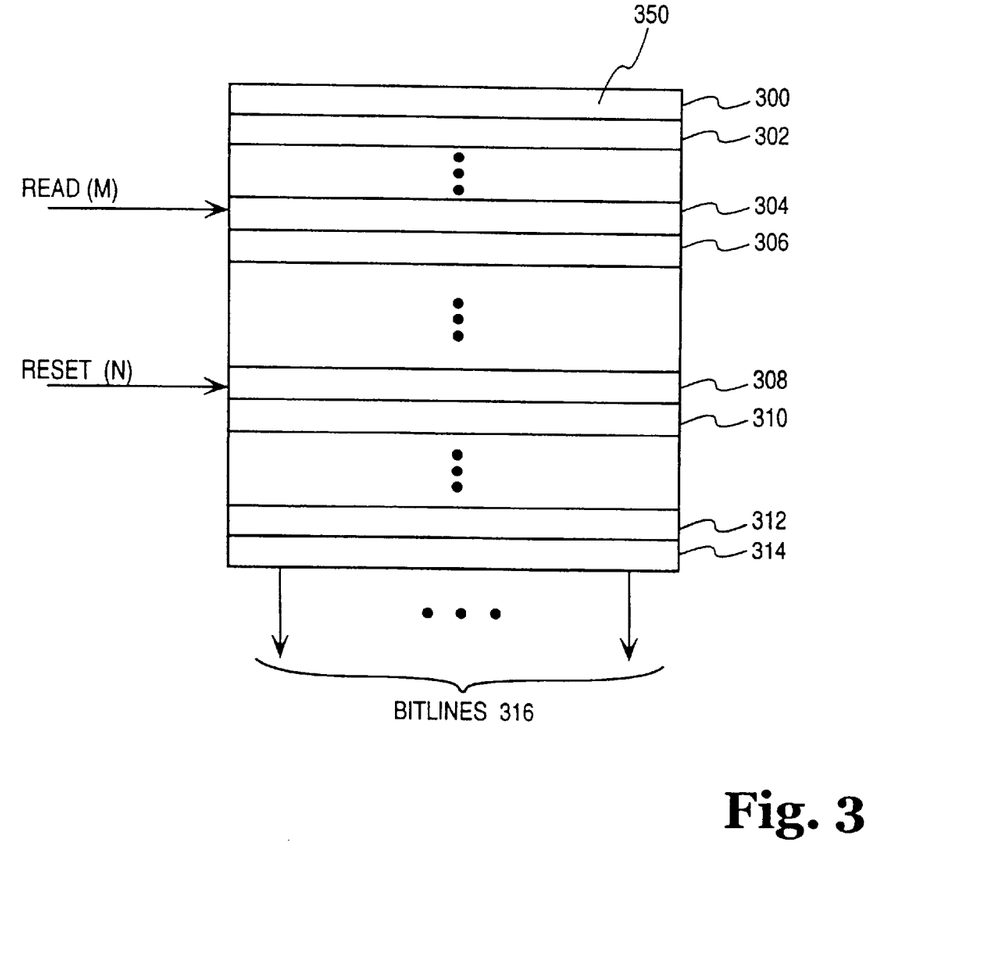
FIG. 3 is a block diagram illustrating a pipelined read operation of a sensor.

FIG. 3 is a block diagram illustrating the operation of a pipelined read-out method of operation, wherein a sensor array 350 contains rows 300 and 302 as the first two rows in the sensor array; rows 304 and 306 as two subsequent rows separate from row 302; and rows 308 and 310 as two additional rows after row 306; and rows 312 and 314 as the last two rows in sensor array 350. Each of the rows in sensory array 350 contains the same number of pixels. For example, each row in sensor array 350 can contain 640 pixels. Thus, the number of lines between row 300 and row 314 is the vertical resolution, while the number of pixels in each row is the horizontal resolution.

READ (M) command is provided to a row in sensor array 350 to read-out the value of each pixel onto a set of bitlines 316. RESET (N)-command is provided to a line to reset the signals in each pixel on that row. The RESET (N) command initiates an operation similar to an "open shutter" operation of a camera, while the READ (M) command initiates and operation similar to a "close shutter" operation of a camera. In FIG. 3, for example, the READ (M) command is provided to row 304, while the RESET (N) command is provided to row 308. By changing the time from which the RESET (N) command is provided to a row to the time that the READ (N) command is provided to that same row, integration time can be adjusted. For example, to vary the integration time for a row of pixels such as row 308, the RESET (N) command is first provided to row 308. At a predetermined period after the RESET (N) command is provided to row 308, the READ (M) command is provided to row 308 to output the signal that represents the intensity of the detected light by each pixel on row 308 of sensor array 250. Also, the period between the time that the RESET (N) command is provided and the time that the READ (M) command is provided is the integration time, as described above, the outputs of the pixel of each row in sensor array 350 is provided through a set of bitlines 316.

Figure 4:
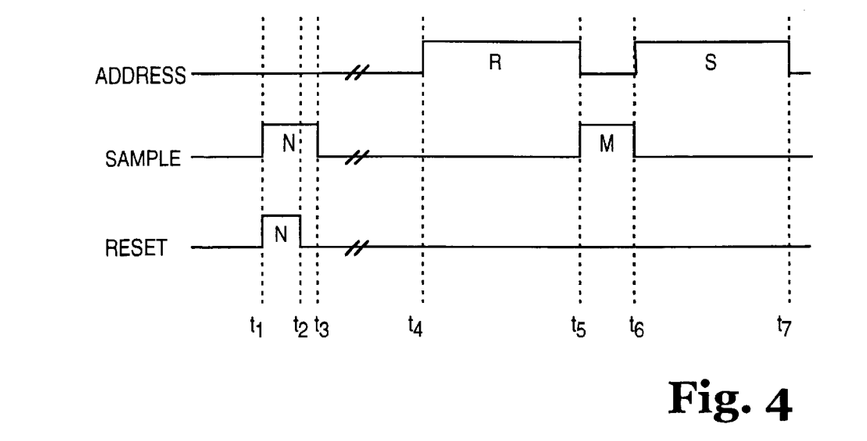
FIG. 4 is a timing diagram showing control signals used in the operation of the pixel circuit of FIG. 1 in accordance with one embodiment of the present invention.

FIG. 4 is a timing diagram illustrating the operation of pixel 100 in accordance with the preferred method of the present invention, where the ADDRESS signal, the SAMPLE signal, and the RESET signal are shown over time.

At time t1, RESET (N) command is received at the sensor array, initiating the open shutter command. Thus, the SAMPLE signal and RESET signal are asserted so that node A is brought to the reset voltage level, which is approximately $V_{CC}-V_{TM1}$. By asserting the SAMPLE signal, node B is also brought to the same reset level as node A. Thus, node B will track node A. At time t2, the RESET signal is removed from transistor M1, thereby removing the $V_{CC}$ voltage from node A. At time t3, the SAMPLE signal is removed from transistor M2, thereby isolating node B from node A, storing VRESET1 on capacitor C1. The SAMPLE signal is removed after the RESET signal is removed (i.e., node B is isolated from node A after the $V_{CC}$ voltage is removed from node A), to allow the captured signal at node B (i.e., the reset level R) to include the noise generated by the KT/C noise (i.e., the switching noise) of transistor M1. In one preferred embodiment, time t3 and time t2 are very close in proximity. This is to allow the captured reset level at node B to match, as closely as possible, the beginning reset value at node A, as the voltage at node A will begin to decay (i.e., the integration time will begin), immediately after the RESET signal is removed from transistor M1.

At time t4, the READ (M) signal has arrived (i.e., the close shutter command), which will assert the ADDRESS signal to transistor M4, and the voltage at node B will be read-out over the bitline to the post-processing circuits. The output of the value at node B continues until time t5, at which point the address signal is removed from transistor M4.

At time t5, the SAMPLE signal is asserted to transistor M2. The assertion of the SAMPLE signal to transistor M2 will effectively couple node B to node A, allowing the effect of the voltage generated by incident light on photodiode PD1 to be measured. At time t6, the SAMPLE signal is deasserted from transistor M2, which completes the obtainment of the sample value at node B. Also at time t6, the ADDRESS signal is reasserted to transistor M4 to readout value S. In one embodiment, the integration time is measured from time t2 to time t6. At time t7, the ADDRESS signal is removed from transistor M4, thereby completing the read-out of the sample value S. Thereafter, the post-processing circuitry can compare the difference between the sampled value S and the captured reset level R and determine the affect on node A from the incident light being shown on photodiode PD1.

By capturing the reset value before integration, fluctuations of the power supply (i.e., $V_{CC}$), is avoided as the actual reset level R from which the decay begins, at node A, is captured at the beginning of the integration period. In addition, by removing the SAMPLE signal from transistor M2 after the RESET signal is removed from transistor M1, the switching noise of transistor M1 (i.e., KT/C noise), is incorporated into the reset level for all reset levels, thereby offering a fixed noise which can be removed by appropriate compensation.

Figure 5:
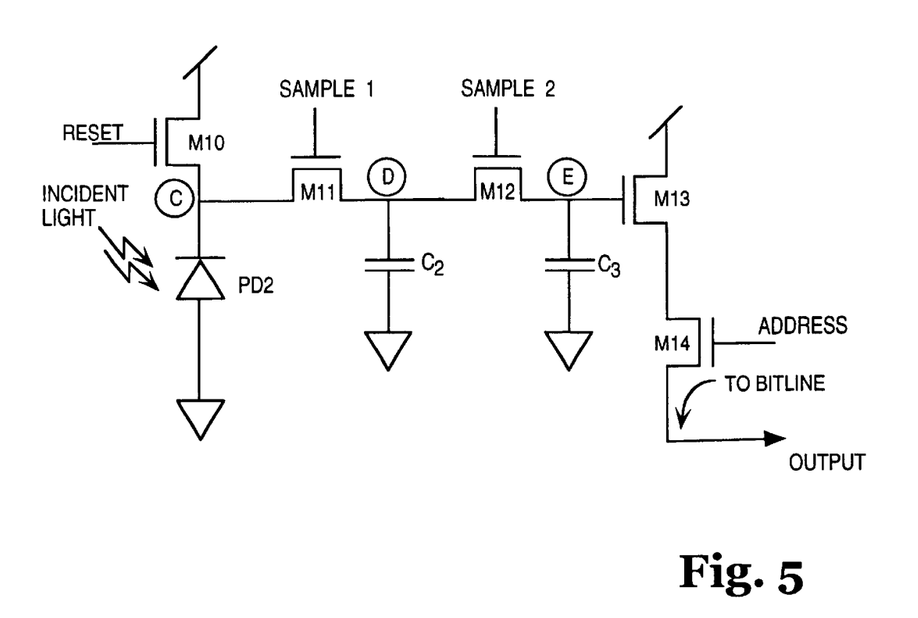
FIG. 5 is a second pixel circuit configured in accordance to a second embodiment of the present invention.

FIG. 5 is a circuit diagram of a second pixel circuit 200 configured in accordance with one embodiment of the present invention that may be built using MOS fabrication processes. Pixel 200 includes a photodiode PD2 coupled to a RESET field-effect transistor (FET) M10 with an electronic shutter mechanism provided by a SAMPLE transistor M11 and a storage capacitor C2. Pixel 200 also includes a secondary storage mechanism provided by a second SAMPLE transistor M12 and a second storage capacitor C3. The process for manufacturing the circuit of pixel 200 is identical to the process of manufacturing the circuit of pixel 100, except for the addition of transistor M12 and capacitor C3 in between node D and the gate of transistor M13. Pixel 200 is used for systems where a non-pipeline read-out processes not used. Thus, pixel 200 is used in methods similar to prior art image capture circuits where all pixels of a sensor is exposed to an image at one time, and the captured charges are read-out from the sensor array, one row at a time.

Figure 6:
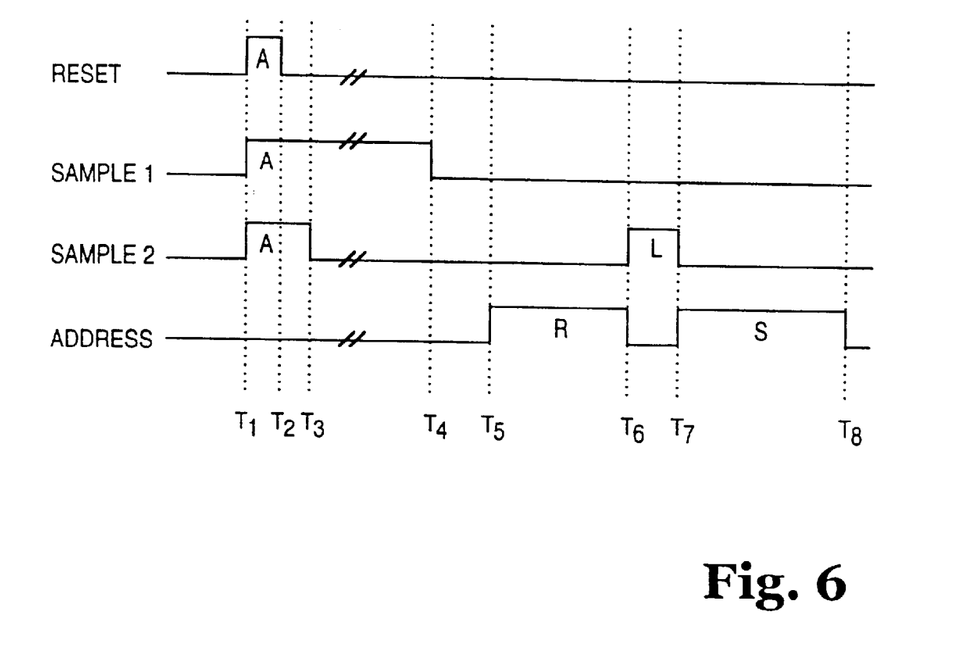
FIG. 6 is a timing diagram showing control signals used in the operation of the second pixel circuit of FIG. 5 in accordance with one embodiment of the present invention.

FIG. 6 is a timing diagram of the control signals used in the operation of pixel 200. A RESET signal, a SAMPLE1 signal, a SAMPLE2 signal, and an ADDRESS signal is shown over time.

At time T1, the RESET signal, the SAMPLE1 signal, and the SAMPLE2 signal are all asserted. Thus, the RESET signal is asserted to transistor M10, the SAMPLE1 signal is asserted to transistor M11, and the SAMPLE2 signal is asserted to M12. It is to be noted that these three signals are asserted to all of the pixel circuits in the sensor array at the same time. Thus, all sensors are being operated at the same time to capture an image. After time T1, the voltages at node C, node D, and node E should be at approximately the same level.

At time T2, the RESET signal is removed from transistor M10, which allows the charge on photodiode PD2 to decay in response to the incident light. Thus, at time T2, the integration period has begun.

At time T3, the SAMPLE2 signal is deasserted from transistor M12, thereby capturing the reset level of the voltage at node E, propagated through node D and node C. In one embodiment, time T3 is very close to time T2, so as to ensure that the reset level captured by and stored in capacitor C3 is as close as possible to the reset level present on node C when the RESET signal is removed from transistor M10 as possible.

At time T4, the SAMPLE1 signal is removed from transistor M10, thereby capturing the voltage level at node C on capacitor C2. After time T4, all pixel circuits on the sensor array contain both the reset level, which is stored at a capacitor on each pixel circuit such as capacitor C3, and a charge which represents the amount of incident light which fell on photodiode PD2 during the integration time on a capacitor on each pixel circuit such as capacitor C2. Thereafter, each row is read individually so as to output these stored signal levels to a post-processing circuit over the bitlines. Thus, the integration time is from time T2 to time T4.

In time T5, the ADDRESS signal is asserted to transistor M14 to read-out the stored reset level that is contained on capacitor C3 (i.e., node E). As described for pixel 100, the application of the ADDRESS signal to transistor M14 will cause transistor M14 to act as a switch to allow an output signal related to the value and node E to appear at the OUTPUT node.

At time T6, the ADDRESS signal is removed from transistor M14 and at approximately the same time, the SAMPLE2 signal is asserted to transistor M12. The provision of the SAMPLE2 signal to transistor M12 will effectively couple node D and node E together. Therefore, charge will flow between node D and node E, thereby creating a voltage at node E which is representative of the sampled value S.

At time T7, the ADDRESS signal line is asserted again to transistor M14, which provides a signal value on the output node which is representative of the voltage level at node E and places it on the bitline for the post-processing circuitry. At time T8, the ADDRESS signal is deasserted from transistor M14, which ends the output of the sampled value S at the OUTPUT node.

Figure 7:
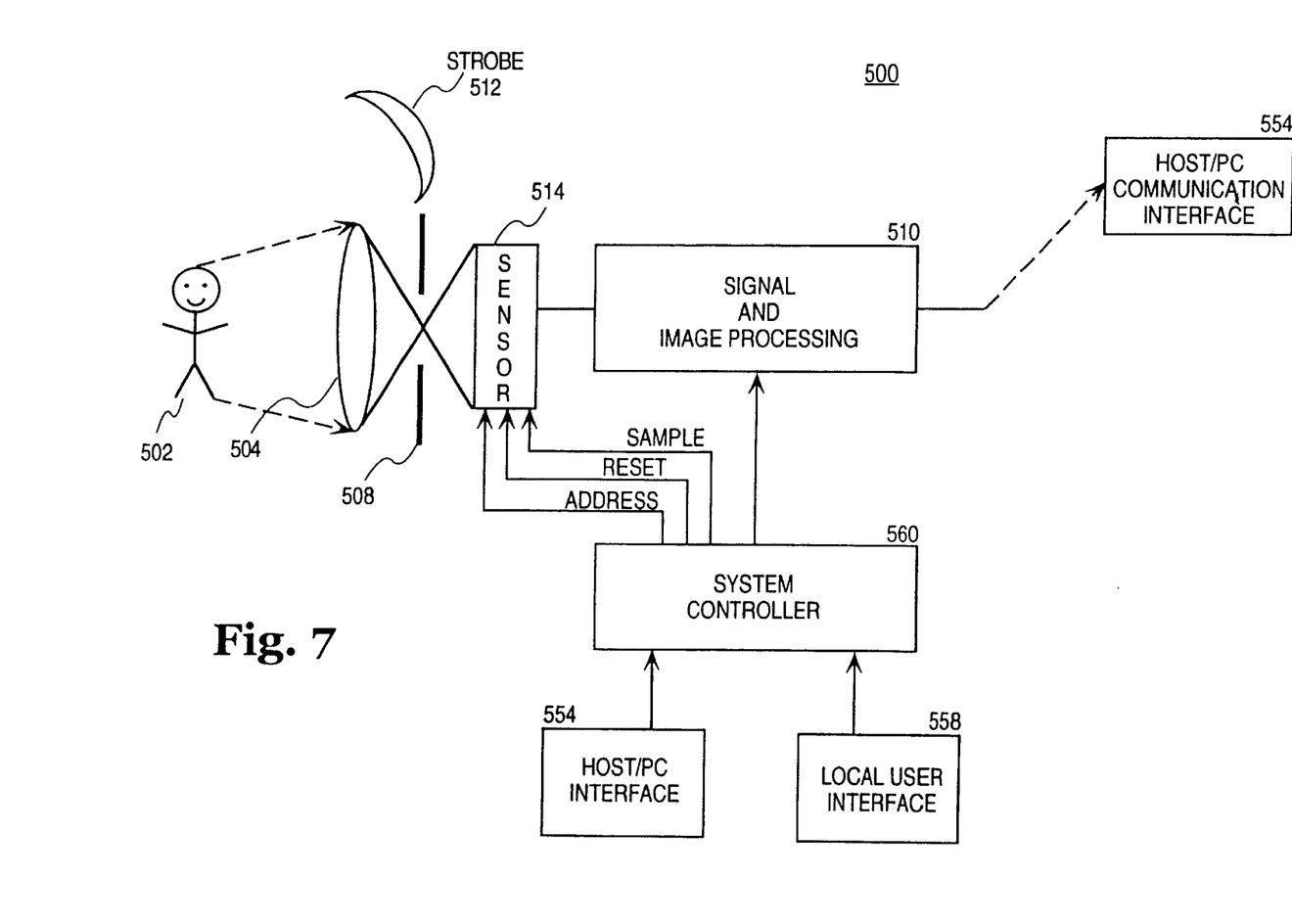
FIG. 7 is a block diagram of a digital image capture system in accordance with the present invention.

An embodiment of the invention as an imaging system 500 is shown as a logical block diagram in FIG. 7. The imaging system 500 includes a number of conventional elements, such as an optical system having a lens 504 and aperture 508 that is exposed to the incident light reflected from a scene or object 502. The optical system properly channels the incident light towards the image sensor 514, which, by virtue of having an array of pixels configured similar to pixel 100, generates sensor signals in response to an image of the object 502 being formed on the sensor 514. The various control signals used in the operation of pixel 100, such as the RESET signal, the SAMPLE signal, and the ADDRESS signal, is generated by a system controller 560. The controller 560 may include a microcontroller or a processor with input/output (I/O) interfaces that generates the control signals in response to instructions stored in a non-volatile programmable memory. Alternatively, a logic circuit that is tailored to generate the control signals with proper timing can be used. The system controller also acts in response to user input via the local user interface 558 (as when a user pushes a button or turns a knob of the system 500) or the host/PC interface 554 to manage the operation of the imaging system 500.

To obtain compressed and/or scaled images, a signal and image processing block 510 is provided in which hardware and software operates according to image processing methodologies to generate captured image data with a predefined resolution in response to receiving the sensor signals. Optional storage devices (not shown) can be used aboard the system 500 for storing the captured image data. Such local storage devices may include a removable memory card. A host/Personal Computer (PC) communication interface 554 is normally included for transferring the captured image data to an image processing and/or viewing system such as a computer separate from the imaging system 500. The imaging system 500 can optionally contain a display means (not shown) for displaying the captured image data. For instance, the imaging system 500 may be a portable digital camera having a liquid crystal display or other suitable low power display for showing the captured image data.

The embodiments of the invention described above are, of course, subject to other variations in structure and implementation. For instance, pixels 100 features transistors whose dimensions may be selected by one skilled in the art in order to achieve proper circuit operation as described above while minimizing power consumption. Also, the value of the storage capacitor may also be selected by one skilled in the art so as to provide the desired trade off between sensitivity and noise immunity, with lower capacitance yielding higher sensitivity but lower noise immunity. The integration time can also be varied so as to yield the desired trade off between pixel resolution and image frame rate. Therefore, the scope of the invention should be determined not by the embodiments illustrated but by the appended claims and their legal equivalents.

While the present invention has been particularly described with reference to the various figures, it should be understood that the figures are for illustration only and should not be taken as limiting the scope of the invention. Many changes and modifications may be made to the invention, by one having ordinary skill in the art, without departing from the spirit and scope of the invention.

What is claimed is:

1. An apparatus comprising:

a sensor array having a plurality of groups of photocells that form substantially the entire sensor array, each group of photocells being coupled to provide output voltages on a respective bitline, each photocell in a group having a reset device coupled to reset a photodetector in response to a reset signal being asserted, a sample device coupled to provide a low impedance path between the photodetector and a storage device, a second storage device and a second sample device coupled between (1) the storage and sample devices and (2) the photodetector, and a readout circuit coupled between the storage device and the respective bitline to provide an output voltage in response to an address signal being asserted; and a controller coupled to control the sensor array by asserting a sample signal and a reset signal to generate a reset voltage at a storage node of each photocell in a first group of photocells in the sensor array, and asserting a second sample signal, while asserting the reset signal, to generate a second voltage at a second node of each photocell in the first group; and then deasserting the reset signal prior to deasserting the sample signal so that the reset voltage is captured at the storage node; and then asserting a first address signal to read the captured reset voltage at the storage node, waiting an integration period after deasserting the reset signal, deasserting the second sample signal at the end of an integration period for the first group before reading an exposed voltage at the storage node, and generating a difference between the exposed voltage and the captured reset voltage.

2. The apparatus of claim 1 wherein each group of photocells forms a column and the first group forms a row.

3. The apparatus of claim 1 wherein the photodetector in each photocell includes a photodiode built using a MOS fabrication process.

4. The apparatus of claim 1 wherein each device is a single transistor.

5. The apparatus of claim 1 wherein the controller is to further control the sensor array by asserting and deasserting the sample signal a second time to capture the exposed voltage.

6. The apparatus of claim 1 wherein the controller is to further control the sensor array to repeatedly generate and read a reset voltage and an exposed voltage from the sensor array to read an image, in a pipelined manner.

* * * * *

UNITED STATES PATENT AND TRADEMARK OFFICE
CERTIFICATE OF CORRECTION

PATENT NO.     : 6,317,154 B2                                                                    Page 1 of 1
DATED          : November 13, 2001
INVENTOR(S)    : Beiley

It is certified that error appears in the above-identified patent and that said Letters Patent is hereby corrected as shown below:

Column 3,
Line 50, delete "light-generated generated electron-hole" and insert -- light-generated electron-hole --.

Signed and Sealed this

Twenty-seventh Day of August, 2002

Attest:

Attesting Officer

JAMES E. ROGAN
Director of the United States Patent and Trademark Office